(12) United States Patent
Tokunaga et al.

(10) Patent No.: US 6,680,221 B2
(45) Date of Patent: Jan. 20, 2004

(54) BARE CHIP MOUNTING METHOD AND BARE CHIP MOUNTING SYSTEM

(75) Inventors: Tetsuya Tokunaga, Takatsuki (JP); Takahiro Yonezawa, Neyagawa (JP); Hiroyuki Kiyomura, Takatsuki (JP); Tatsuo Sasaoka, Osaka (JP); Satoshi Horie, Kadoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/267,668

(22) Filed: Oct. 10, 2002

(65) Prior Publication Data

US 2003/0096451 A1 May 22, 2003

(30) Foreign Application Priority Data

Oct. 11, 2001 (JP) ........................................ 2001-314210

(51) Int. Cl.[7] ............................................... H01L 21/44
(52) U.S. Cl. ........................ 438/113; 438/114; 438/460; 438/464
(58) Field of Search ................................ 438/113, 114, 438/458, 460, 461, 462, 463, 464, 465, 616

(56) References Cited

U.S. PATENT DOCUMENTS

| | | | | |
|---|---|---|---|---|
| 3,735,483 A | * | 5/1973 | Sheldon | 438/113 |
| 5,791,484 A | | 8/1998 | Ikeda et al. | |
| 5,897,337 A | * | 4/1999 | Kata et al. | 438/114 |
| 6,171,163 B1 | * | 1/2001 | Seko et al. | 445/24 |
| 6,225,205 B1 | * | 5/2001 | Kinoshita | 438/613 |
| 6,344,402 B1 | * | 2/2002 | Sekiya | 438/460 |
| 6,448,156 B1 | * | 9/2002 | Tieber | 438/464 |
| 6,498,075 B1 | * | 12/2002 | Fujimoto et al. | 438/462 |

* cited by examiner

Primary Examiner—Kevin M. Picardat
(74) Attorney, Agent, or Firm—Greenblum & Bernstein, P.L.C.

(57) ABSTRACT

A bare chip mounting method includes: a dicing step for dividing a semiconductor wafer into individual IC chips while the semiconductor wafer is being attached to a carrier; a washing step for washing the diced semiconductor wafer; a bump-bonding for carrying the washed semiconductor wafer to an assembly process while the semiconductor wafer is being attached to the carrier so as to form a bump on an electrode pad of the wafer; and a mounting step for mounting each of the IC chips, on which the bump is formed, onto a circuit formation body.

20 Claims, 5 Drawing Sheets

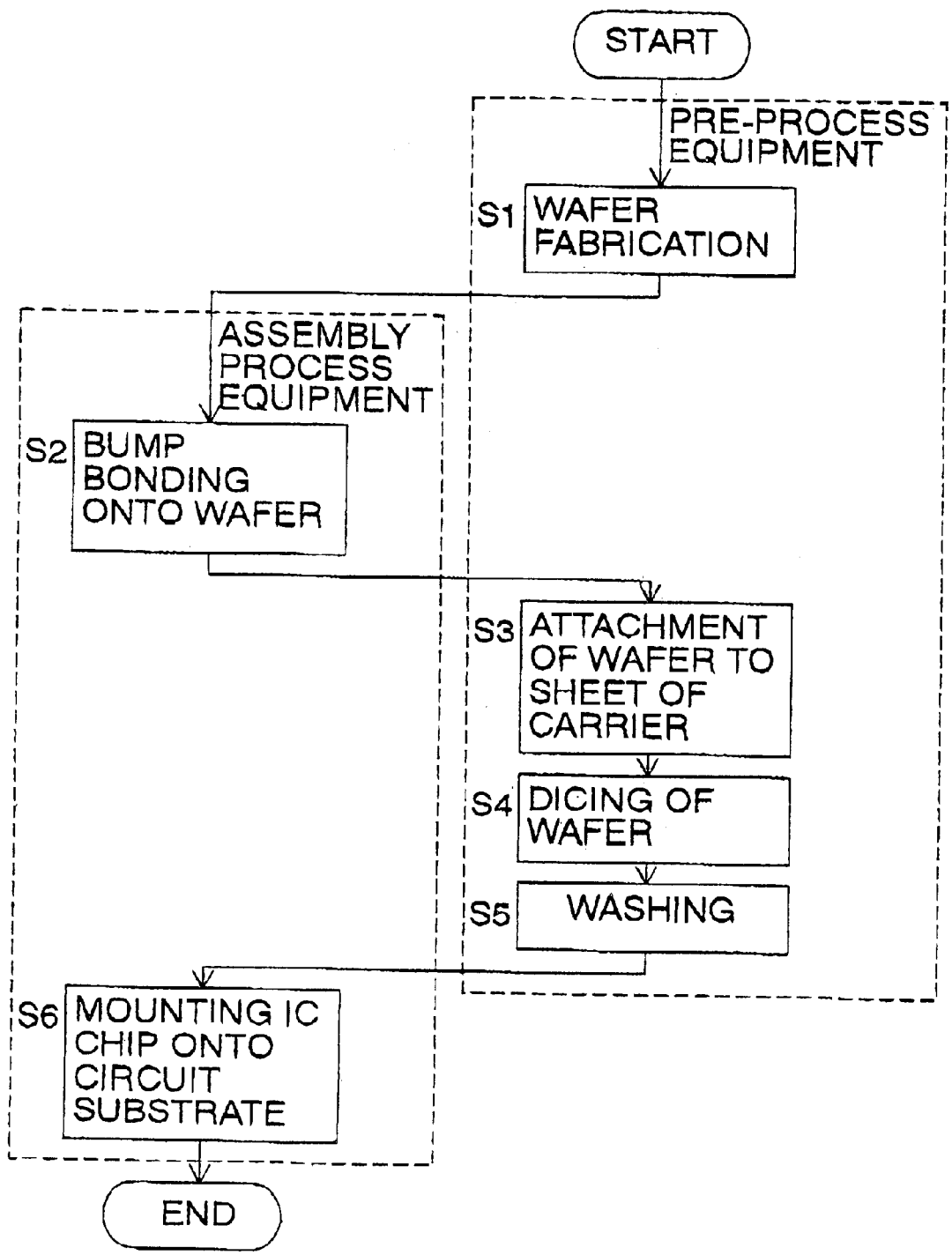

BARE CHIP MOUNTING METHOD AND BARE CHIP MOUNTING SYSTEM

The present disclosure relates to subject matter contained in priority Japanese Patent Application No. 2001-314210, filed on Oct. 11, 2001, the contents of which is herein expressly incorporated by reference in its entirety.

BACKGROUND OF THE INVENTION

1. Field of the Invention

The present invention relates to a bare chip mounting method, as is represented by a flip-chip method for forming a bump on an electrode pad provided on a semiconductor wafer and directly bonding the bump and a circuit formation body such as a circuit substrate to each other without using a lead wiring, and to a bare chip mounting system.

2. Description of Related Art

Recently, there has been a demand for downsizing and weight-reduction in electronic equipment. In compliance with such a demand, a flip-chip mounting technique has been widely employed for the purpose of increasing an IC mount density on an electronic circuit; in the flip-chip mounting technique, bare chip type semiconductor integrated circuit chips (hereinafter, referred to simply as IC chips), which are obtained by dividing a wafer into individual chips, are directly mounted face down. As examples of products fabricated by the flip-chip mounting technique, a CSP (Chip Size Package) whose size is equal to an IC chip housed therein and an MCM (Multi Chip Module) for mounting a plurality of IC chips on a circuit substrate are given. The production amount of these products is in increase. An SBB (Stud Bump Bonding) technique, which is one of the flip-chip mounting techniques, applies a wire bonding technique to form bumps on electrode pads of each IC chip in a semiconductor wafer, so that the bumps and wiring electrodes formed on a circuit substrate are directly bonded to each other without through a lead wiring.

Along with advanced miniaturization of portable electronic equipment, the reduction in size as well as in thickness of the IC chip has been further encouraged. For this purpose, among bare chip mounting systems, there is a system having such a structure that allows bump bonding to be performed on a semiconductor wafer prior to dicing for dividing the semiconductor wafer into IC chips. Furthermore, in the case of a thin semiconductor wafer having a thickness of 0.2 mm or less, a carrier is used so as to perform the carriage without causing any damage such as crack, edge chipping, or breakdown of a circuit. This carrier has a structure, in which a sheet is provided in a tensioned state over a lower surface of a protection ring. A semiconductor wafer is carried while being attached to the sheet so as to be surrounded by the protection ring.

FIG. 6 is a flow chart showing a control process of a conventional flip-chip mounting technique. In FIG. 6, in pre-process equipment, after fabrication of a semiconductor wafer (step S1), the semiconductor wafer is carried to assembly process equipment and bumps are formed on the semiconductor wafer (step S2). The semiconductor wafer, on which the bumps are bonded, is carried to the pre-process equipment and is attached to a sheet of a carrier (step S3). Then, the semiconductor wafer is diced (step S4) and then is washed (step S5). Subsequently, the semiconductor wafer is returned to the assembly process equipment where IC chips fabricated by dicing the semiconductor wafer are flip-chip mounted onto a circuit substrate (step S6).

In the conventional bare chip mounting method, however, scraps are generated when the semiconductor wafer is diced after bump bonding. Although the semiconductor wafer is washed with pure water in a post-process, the scraps still partially remain in a connection part between a bump and an electrode of the circuit substrate. Thereby, when the IC chip fabricated by dicing the semiconductor wafer is flip-chip mounted onto the circuit substrate, poor electrical conduction may possibly occur between the IC chip and the circuit substrate due to the remaining scraps.

What is worse, after the semiconductor wafer, on which the bump-bonding is performed in the assembly process equipment, is temporarily carried to the pre-process equipment for dicing and washing, the semiconductor wafer is returned to the assembly process equipment so that the IC chips are flip-chip mounted onto the circuit substrate. A great loss in time as well as in effort is disadvantageously generated. This problem arises because a pure water supply device is generally absent in a clean room of the assembly process equipment in many cases whereas a pure water supply device is provided for a clean room of the pre-process equipment.

SUMMARY OF THE INVENTION

In light of the above-mentioned problems, the present invention has an object of providing a bare chip mounting method and a bare-chip mounting system, capable of preventing the poor electrical conduction from occurring between an IC chip and a circuit substrate due to scraps generated upon dicing of a semiconductor wafer and capable of reducing a loss in time as well as in effort.

In order to achieve the above object, a bare chip mounting method according to the present invention includes: a dicing step for dividing a semiconductor wafer into individual IC chips while the semiconductor wafer is being attached to a carrier; a washing step for washing the diced semiconductor wafer; a bump-bonding step for carrying the washed semiconductor wafer to an assembly process while the semiconductor wafer is being attached to the carrier so as to form a bump on an electrode pad of the semiconductor wafer; and a mounting step for mounting each of the IC chips, on which the bump is formed, onto a circuit formation body.

In this bare chip mounting method, prior to the bump bonding to the semiconductor wafer, the wafer is diced and the scraps generated by the dicing are removed by washing in a clean room of pre-process equipment. Then, the semiconductor wafer is carried from the pre-process equipment to assembly process equipment where the bump bonding is carried out. Since the scraps generated by the dicing do not adhere to the bump, poor electrical conduction between the IC chip and the circuit substrate due to the scraps does not occur. Moreover, since it is sufficient to carry the semiconductor wafer only once between the pre-process equipment and the assembly process equipment, a loss in time as well as in effort is reduced.

A bare chip mounting system according to the invention includes: a dicing device for dividing a semiconductor wafer into individual IC chips while the semiconductor wafer is being attached to a carrier; a washing device for washing the diced semiconductor wafer; a carrying device for carrying the washed semiconductor wafer to assembly process equipment while the semiconductor wafer is being attached to the carrier; a bonding head for forming a bump on an electrode pad of the semiconductor wafer; and a flip-chip bonder for mounting each of the IC chips, on which the bump is formed, onto a circuit formation body.

While novel features of the invention are set forth in the preceding, the invention, both as to organization and content, can be further understood and appreciated, along with other objects and features thereof, from the following detailed description and examples when taken in conjunction with the attached drawings.

BRIEF DESCRIPTION OF THE DRAWINGS

FIG. 6 is a flow chart showing a control process of a conventional flip chip mounting technique.

DETAILED DESCRIPTION OF THE PREFERRED EMBODIMENTS

Figure 1:
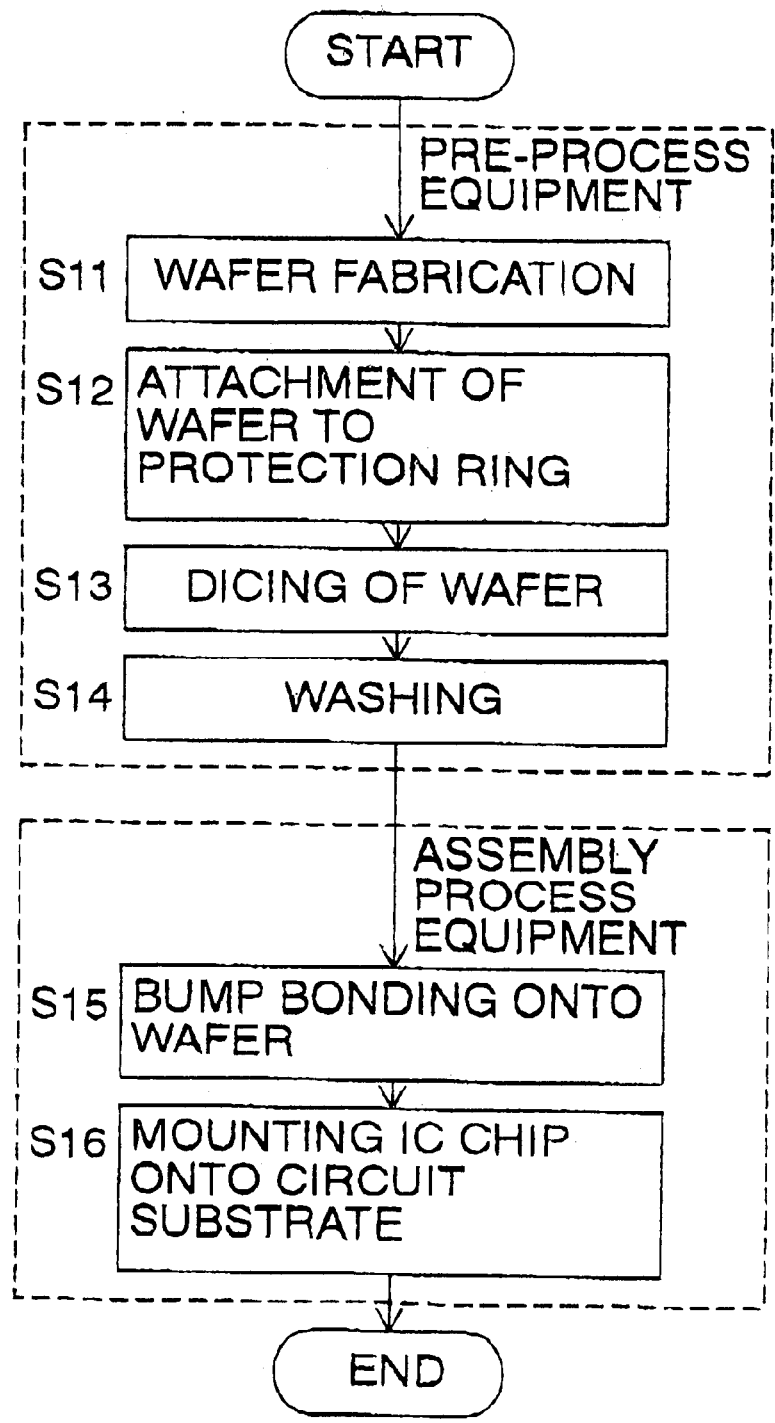
FIG. 1 is a flow chart showing a control process of a bare chip mounting method according to an embodiment of the present invention.
Figure 5:
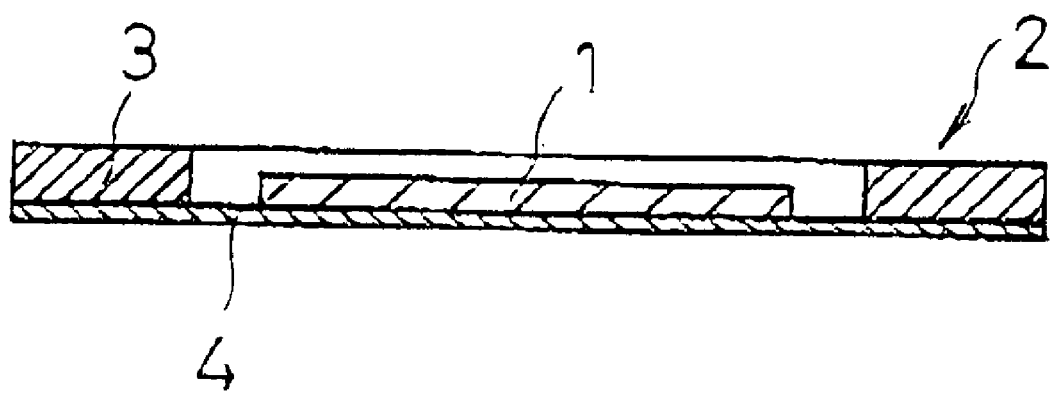
FIG. 5 is a longitudinal cross-sectional view showing a semiconductor water that is held by a carrier.

Hereinafter, preferred embodiments of the present invention will be described with reference to the accompanying drawings. FIG. 1 is a flow chart showing a control process of a bare chip mounting method according to an embodiment of the invention. In FIG. 1, in pre-process equipment, a semiconductor wafer 1 is fabricated by a wafer fabrication device (step S11). Thereafter, the semiconductor wafer 1 is attached to a sheet 4 of a carrier 2 so as to be fixed thereto while being surrounded by a protection ring 3 as shown in FIG. 5 (step S12). The dicing is carried out on the semiconductor wafer 1 which is fixed onto the carrier 2 (step S13). The diced semiconductor wafer 1 is, washed by using a pure water supply device placed in a clean room of the pre-process equipment (step S14).

Subsequently, the semiconductor wafer 1 is carried to assembly process equipment while being fixed onto the carrier 2, where the bump bonding is carrier out (step S15). Finally, each of individual IC chips obtained by dicing the semiconductor wafer 1 is flip-chip mounted onto a circuit substrate by a flip chip bonder in the assembly process equipment (step S16).

In this bare chip mounting method, the semiconductor wafer 1 is diced and the scraps generated by the dicing are removed by washing in the clean room of the pre-process equipment prior to the bump bonding on the semiconductor wafer 1. Then, the semiconductor wafer 1 is carried to the assembly process equipment where the bump bonding is carried out. Since the scraps generated by the dicing do not adhere to the bump, the poor electrical conduction between the IC chip and the circuit substrate due to the scraps does not occur. Moreover, since it is sufficient to carry the semiconductor wafer 1 only once between the pre-process equipment and the assembly process equipment, a loss in time as well as in effort is reduced.

Figure 2:
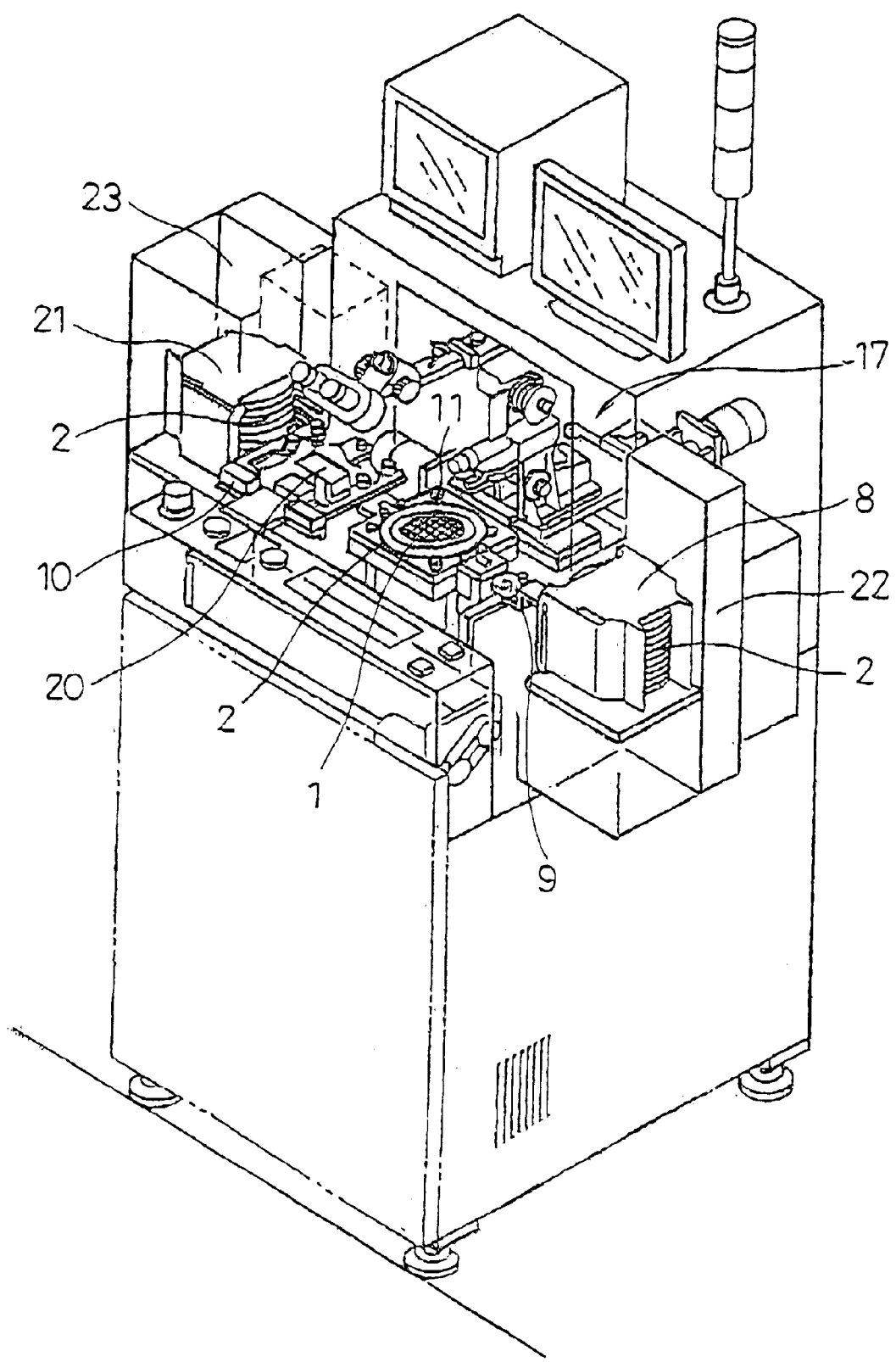
FIG. 2 is a perspective view showing a bump bonding device embodying the bare chip mounting method of FIG. 1.
Figure 3:
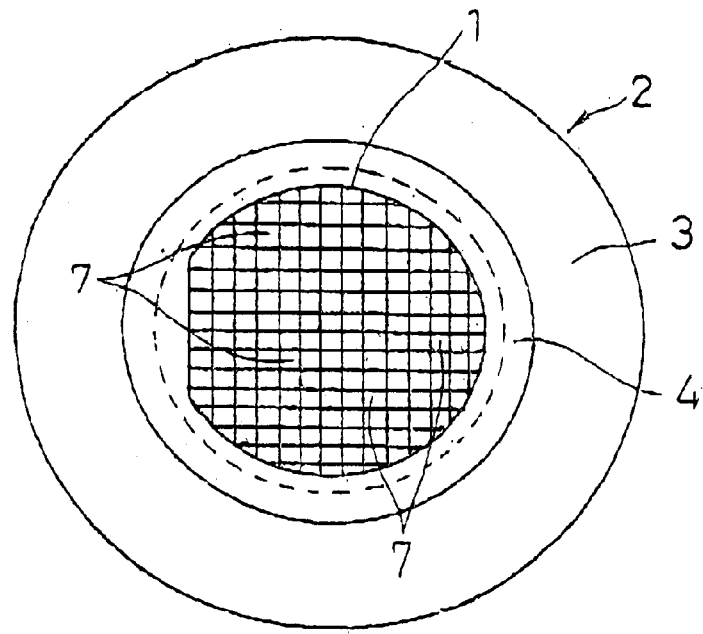
FIG. 3 is a plan view showing a semiconductor wafer after dicing is carried out.

Next, a device realized by embodying the above-described bare chip mounting method will be described. FIG. 2 is a perspective view showing a bump bonding device embodying the above-described bare chip mounting method, the bump bonding device being placed in the assembly process equipment. As shown in FIG. 3, in the pre-process equipment, the semiconductor wafer 1 is diced by a dicing device while being attached to the sheet 4 of the carrier 2. Thereafter, the diced semiconductor wafer 1 is washed. Since the existing dicing device and washing device can be used as the above-mentioned dicing device and washing device in this embodiment, the illustration thereof is herein omitted.

The semiconductor wafer 1, which is diced into individual IC chips 7, is stored in a first storage container 8 shown in FIG. 2 while still being fixed onto the carrier 2. The semiconductor wafer 1 is carried from the clean room of the pre-process equipment to the clean room of the assembly process equipment while being housed within the first storage container 8. The first storage container 8 is lifted up by a first lifting mechanism unit 22 so as to be positioned at a position opposed to a carrying mechanism unit 9. The semiconductor wafers 1 housed within the thus positioned first storage container 8 are fetched by the carrying mechanism unit 9 one by one while still being fixed onto the carrier 2.

Figure 4:
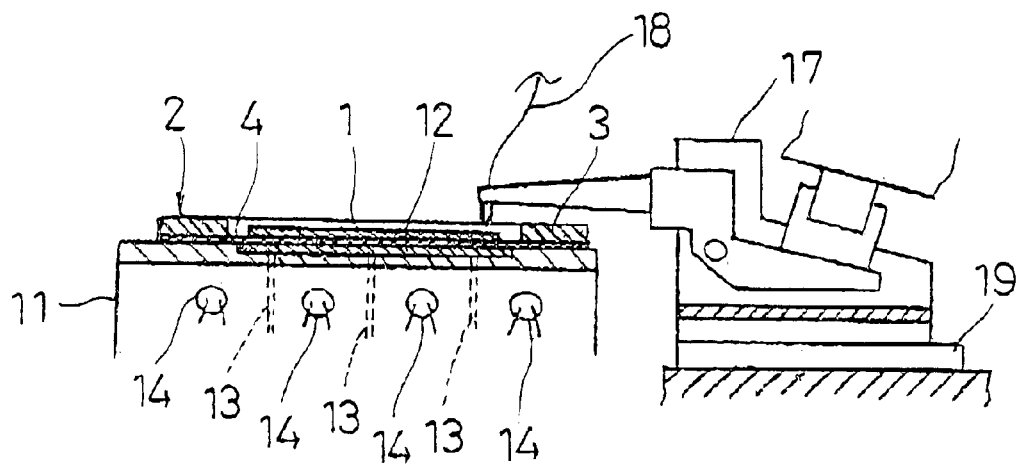
FIG. 4 is a side view showing a peripheral mechanism of a bonding head in the bump bonding device of FIG. 2.

An outer periphery of the protection ring 3 is gripped by a transfer mechanism unit 10 or an upper surface of the protection ring 3 is sucked by a suction pad (not shown) so that the carrier 2 fetched on the carrying mechanism unit 9 is transferred and placed on a bonding stage 11. FIG. 4 is a side view showing the vicinity of the bonding stage 11 in the bump bonding device shown in FIG. 2. A porous part 12 is provided on the upper surface of the bonding stage 11 on which the carrier 2 is placed, whereas a plurality of suction holes 13 in communication with the lower surface of the porous part 12 are provided in the bonding stage 11. The porous part 12 is depressurized through the suction holes 13, so that the carrier 2 is sucked to be fixed onto the porous part 12. Moreover, a heater 14 is embedded in the bonding stage 11 in each space between the suction holes 13. An electrode pad (not shown) formed on each of the IC chips 7 of the semiconductor wafer 1 is heated by the heater 14 so as to have a temperature for bump bonding, that is enough to form a bump on the electrode pad.

A bonding head 17 provided adjacent to the bonding stage 11 is a known device for forming a bump on the electrode pad formed on the semiconductor wafer 1 which is placed on the bonding stage 11 while the semiconductor wafer 1 is still being fixed to the carrier 2. More specifically, the bonding head 17 includes a wire supply unit for supplying a gold wire 18 serving as a material for forming the bumps, a bump production unit for pressing a molten ball formed by melting the gold wire 18 against the electrode pad, an ultrasonic generation unit for applying an ultrasonic wave to the bump upon pressing, and the like. The bonding head 17 is fixed onto an X-Y table 19 having a ball-screw structure or the like, the table which is-movable in X- and Y-directions perpendicularly crossing each other on a plane. With this structure, each time the formation of a bump on an electrode pad of the semiconductor wafer 1 is completed, the bonding head 17 is sequentially moved by the X-Y table 19 so as to be situated on an electrode pad on which a bump is next to be formed. In this manner, the bonding head 17 forms the bumps on all the electrode pads of the semiconductor wafer 1.

The semiconductor wafer 1, for which the bump bonding is completed, is transferred and placed onto a carrying mechanism unit 20 by the transfer mechanism unit 10 while being attached to the carrier 2. Then, the semiconductor wafer 1 is stored in a second storage container 21 by the carrying mechanism unit 20. After being lifted up to a predetermined position by a second lifting mechanism unit 23, the second storage container 21 is carried to a next step. More specifically, the semiconductor wafer 1 is carried to a known flip-chip bonder (not shown) while being housed within the second storage container 21. The flip chip bonder flip-chip mounts the individual IC chip 7, which is obtained by dicing the semiconductor wafer 1 fixed onto the sheet 4 of the carrier 2, onto the circuit substrate.

As described above, according to the bare chip mounting method of the present invention, the semiconductor wafer is diced prior to the bump bonding to the semiconductor wafer. After the scraps generated by the dicing are removed by washing, the bump bonding is carried out. Since the scraps generated by the dicing do not adhere to the bump, poor electrical conduction between the IC chip and the circuit substrate due to the scraps does not occur. Moreover, since it is sufficient to carry the semiconductor wafer only once between the pre-process equipment and the assembly process equipment, a loss in time as well as in effort is reduced.

Furthermore, the bare chip mounting system of the present invention faithfully embodies the bare chip mounting method of the invention. The use of the carrier ensures reliable carriage of a thin wafer having a thickness of 0.2 mm or less, thereby improving operation rates of the equipment.

Although the present invention has been fully described in connection with the preferred embodiment thereof, it is to be noted that various changes and modifications apparent to those skilled in the art are to be understood as included within the scope of the present invention as defined by the appended claims unless they depart therefrom.

What is claimed is:

1. A bare chip mounting method comprising:
   dicing a semiconductor wafer to divide the wafer into individual IC chips while the semiconductor wafer is attached to a carrier;
   washing the diced semiconductor wafer;
   carrying the washed semiconductor wafer to an assembly process while the semiconductor wafer is attached to the carrier;
   bump-bonding the semiconductor wafer to form at least one bump on an electrode pad of the wafer while the wafer is attached to the carrier; and
   mounting each of the IC chips, on which the at least one bump is formed, onto a circuit formation body.

2. The bare chip mounting method according to claim 1 further comprising:
   providing a protection ring to the carrier.

3. The bare chip mounting method according to claim 1 further comprising:
   attaching the semiconductor wafer to the carrier prior to dicing.

4. The bare chip mounting method according to claim 1 further comprising:
   providing a sheet to the carrier.

5. The bare chip mounting method according to claim 1 further comprising:
   providing a sheet and a protection ring to the carrier.

6. The bare chip mounting method according to claim 1 wherein the bump-bonding includes holding the carrier with suction.

7. The bare chip mounting method according to claim 1 wherein the bump-bonding includes heating the semiconductor wafer.

8. The bare chip mounting method according to claim 1 further comprising:
   holding the carrier on a stage during the bump-bonding.

9. A bare chip mounting system comprising:
   a dicer the divides a semiconductor wafer into individual IC chips after the semiconductor wafer is attached to a carrier;
   a washer that washes the diced semiconductor wafer;
   a transporter that carries the washed semiconductor wafer to assembly process equipment while the semiconductor wafer is attached to the carrier;
   a bonding head that forms at least one bump on an electrode pad of the semiconductor wafer while the semiconductor wafer is attached to the carrier; and
   a flip-chip bonder that mounts each of the IC chips onto a circuit formation body.

10. The bare chip mounting system according to claim 9 wherein the carrier further includes a protection ring.

11. The bare chip mounting system according to claim 9 wherein the carrier further includes a sheet.

12. The bare chip mounting system according to claim 9 wherein the carrier device further includes a protection ring and sheet.

13. The bare chip mounting system according to claim 9 further comprising a stage for holding the carrier.

14. The bare chip mounting system according to claim 9 wherein the stage further comprises a porous part and holes.

15. The bare chip mounting system according to claim 9 further comprising a heater that heats the IC chips.

16. A bare chip mounting method comprising:
   attaching a semiconductor wafer to a carrier;
   dicing the semiconductor wafer to divide the wafer into individual IC chips while the semiconductor wafer is attached to the carrier;
   washing the diced semiconductor wafer;
   transporting the washed semiconductor wafer to an assembly process while the semiconductor wafer is attached to the carrier;
   bump-bonding the semiconductor wafer to form at least one bump on an electrode pad of the wafer while the wafer is attached to the carrier; and
   mounting each of the IC chips, on which the at least one bump is formed, onto a circuit formation body.

17. The bare chip mounting method according to claim 16 further comprising:
   providing a sheet and a protection ring to the carrier.

18. The bare chip mounting method according to claim 16 wherein the bump-bonding includes holding the carrier with suction.

19. The bare chip mounting method according to claim 16 wherein the bump-bonding includes heating the semiconductor wafer.

20. The bare chip mounting method according to claim 16 further comprising:
   holding the carrier on a stage during the bump-bonding.

* * * * *

UNITED STATES PATENT AND TRADEMARK OFFICE
CERTIFICATE OF CORRECTION

PATENT NO. : 6,680,221 B2 Page 1 of 1
DATED : January 20, 2004
INVENTOR(S) : T. Tokunaga et al.

It is certified that error appears in the above-identified patent and that said Letters Patent is hereby corrected as shown below:

Column 6,
Line 5, "the" should be -- that --.

Signed and Sealed this

Sixteenth Day of November, 2004

JON W. DUDAS
*Director of the United States Patent and Trademark Office*